United States Patent
Fukuda et al.

(10) Patent No.: US 7,710,217 B2
(45) Date of Patent: May 4, 2010

(54) MATCHING CIRCUIT AND DUAL-BAND POWER AMPLIFIER

(75) Inventors: Atsushi Fukuda, Yokosuka (JP); Hiroshi Okazaki, Zushi (JP); Shoichi Narahashi, Yokohama (JP)

(73) Assignee: NTT DoCoMo, Inc., Tokyo (JP)

( * ) Notice: Subject to any disclaimer, the term of this patent is extended or adjusted under 35 U.S.C. 154(b) by 301 days.

(21) Appl. No.: 11/960,216

(22) Filed: Dec. 19, 2007

(65) Prior Publication Data

US 2008/0150630 A1 Jun. 26, 2008

(30) Foreign Application Priority Data

Dec. 20, 2006 (JP) .............................. 2006-343271

(51) Int. Cl.
- H03H 7/38 (2006.01)
- H04B 1/04 (2006.01)

(52) U.S. Cl. .......................................... 333/32; 333/33
(58) Field of Classification Search ................... 333/32, 333/33
See application file for complete search history.

(56) References Cited

U.S. PATENT DOCUMENTS

| | | |
|---|---|---|
| 2006/0170492 A1 | 8/2006 | Sheng-Fuh et al. |
| 2006/0261911 A1 | 11/2006 | Fukuda et al. |
| 2007/0018758 A1 | 1/2007 | Fukuda et al. |

FOREIGN PATENT DOCUMENTS

| | | |
|---|---|---|
| EP | 1 605 589 A1 | 12/2005 |
| EP | 1 724 936 A2 | 11/2006 |
| JP | 2003-504929 | 2/2003 |
| WO | 01/05028 A1 | 1/2001 |
| WO | WO 01/97389 A2 | 12/2001 |

OTHER PUBLICATIONS

U.S. Appl. No. 12/115,853, filed May 6, 2008, Fukuda, et al.
Koji Chiba, et al., "Mobile Terminals", NTT DoCoMo Technical Journal, vol. 14, No. 1, pp. 14-19.

*Primary Examiner*—Stephen E Jones
(74) *Attorney, Agent, or Firm*—Oblon, Spivak, McClelland, Maier & Neustadt, L.L.P.

(57) ABSTRACT

There is provided a matching circuit, in which a main-matching block and a sub-matching block are connected in series. The sub-matching block includes: a series matching block of which one end is connected to the main-matching block; and a parallel matching network connected to the other end of the series matching block. At a first frequency $f_1$, the connection point of the series matching block and a first parallel matching block is caused to be in an open state for a radio-frequency signal, and the connection point of the first parallel matching block and the second parallel matching block is caused to be in a short state for the radio-frequency signal. Impedance matching is performed by the main-matching block and the series matching block at the first frequency $f_1$, and is performed by the main-matching block and the sub-matching block at the second frequency $f_2$.

8 Claims, 9 Drawing Sheets

MATCHING CIRCUIT AND DUAL-BAND POWER AMPLIFIER

TECHNICAL FIELD

The present invention relates to a matching circuit and a power amplifier using the matching circuit.

BACKGROUND ART

In recent years, with diversification of services provided by radio communication, there is a demand for multiband operation in radio equipment capable of dealing with information in plural frequency bands. For example, two frequency bands, which are 5.2 GHz and 2.4 GHz bands, are specified in the respective standards of Institute of Electrical and Electronic Engineers (IEEE) 802.11a/b/g that are the technical standards of wireless Local Area Network (LAN).

As one of the devices implemented in the radio equipment, a power amplifier is used that amplifies signals of a radio frequency band and supplies the signals to an antenna. A power amplifier is one of such devices that consume a large amount of power in a radio circuit, and are required to operate at a high efficiency. Generally, in the design of a radio circuit, optimization has been made for only a specific frequency band. In the design of a power amplifier, for example, the optimization includes obtaining a high output power and a high efficiency. It is therefore difficult to design such a circuit that is optimized for both of the aforementioned two different frequency bands, for example. For this reason, it is generally configured such that a switch selectively changes the circuits optimally designed for respective frequency bands.

FIG. 1 illustrates an example of the circuit configuration generally employed for a power amplifier (dual-band power amplifier) capable of amplifying signals of two frequency bands. For example, it is assumed that the center frequencies of the two frequency bands are set, such as $f_1$=5.2 GHz and $f_2$=2.4 GHz. A dual-band power amplifier 900, as illustrated in FIG. 1, is provided with: an amplifier 921 designed exclusively for the frequency band of the center frequency $f_1$ (hereinafter, simply referred to as frequency band of the frequency $f_1$ or frequency band of $f_1$, the same applies to $f_2$); and an amplifier 922 designed exclusively for the frequency band of the center frequency $f_2$. Either the amplifier 921 or the amplifier 922 is chosen by switching a single-pole double-throw (SPDT) switch 911 connected to an input terminal 931 and an SPDT switch 912 connected to an output terminal 932, according to the operating frequency, namely the frequency $f_1$ or $f_2$.

Koji Chiba, Isao Hirakodama, Toru Takahashi, Naoki Naruse and Hisashi Yoshinaga, "Mobile Terminals" NTT DoCoMo Technical Journal, Vol. 14, No. 1, for example, discloses such a conventional technique.

Each of the amplifiers 921 and 922 of FIG. 1 includes: an input-side matching circuit 971; an amplification device 972; and an output-side matching circuit 973, as depicted in FIG. 2. The performance of the amplifier depends on the characteristics of the amplification device and those of the matching circuits. It is therefore important to optimize the matching circuits at the frequency bands at which the amplifier operates. The circuit configuration of the dual-band power amplifier 900 of FIG. 1 allows each amplifier to use the matching circuit optimized for the frequency band only for the amplifier. The two amplifiers each provided with such optimized matching circuits are switched by the SPDT switches according to the operating frequency band. Hence, if the insertion loss of the SPDT switch is sufficiently small, the amplifier with the characteristics of high output and high efficiency will be available, accordingly.

Such a dual-band power amplifier requires two systems of circuits, in total, which includes an amplifier for the frequency $f_1$ and an amplifier for the frequency $f_2$. This causes a problem that the number of components such as the input and output matching circuits, amplification devices, etc will be increased. The increased number of the components also causes other problems that the device size is increased, and in addition, the power consumption in the whole circuit is increased by the power consumption in each component.

In addition, there is another problem that the output power is lowered by the insertion loss of the SPDT switch used for output in particular, thereby decreasing the efficiency.

Furthermore, when a combined signal of two frequency bands is simultaneously amplified with a high efficiency in each of the frequency bands, it is necessary to employ a splitter and a combiner for the SPDT switches 911 and 912, respectively. This has a drawback of increasing the circuit size (see Japanese Patent Application Laid Open No. 2003-504929, for example).

Thus, there exists a need for a dual-band power amplifier capable of amplifying a combined signal of two frequency bands at each of the frequency bands simultaneously without providing two systems of circuits for the amplifier for $f_1$ and the amplifier for $f_2$. There also exists a need for a matching circuit capable of performing the impedance matching on the combined signal of the two frequency bands, suited for such a dual-band power amplifier, at each of the frequency bands simultaneously. It should be appreciated that since such a matching circuit can be broadly used for a device that has to perform impedance matching between the signals of two frequency bands, such a matching circuit is not limited to be used in the dual-band power amplifier.

SUMMARY OF THE INVENTION

It is therefore an object of the present invention is to provide a matching circuit that is capable of matching impedance for a combined signal of two frequency bands at each of two frequency bands simultaneously, and to provide a dual-band power amplifier that is capable of amplifying the composite signal of the two frequency bands at each of the two frequency bands simultaneously.

A matching circuit according to one aspect of the present invention comprises: a main-matching block which performs impedance matching; and a sub-matching block which performs the impedance matching, the main-matching block and the sub-matching block being connected in series with each other in a signal path of a radio-frequency signal, wherein the sub-matching block comprises: a series matching block connected in series with the main-matching block; and a parallel matching network connected to the series matching block on the side opposite from the main-matching block, and also connected in parallel with the signal path, wherein the parallel matching network comprises: a first parallel matching block having one end connected to the series matching block; a second parallel matching block having one end connected to the other end of the first parallel matching block; and a third parallel matching block having one end connected to a connection point between the first parallel matching block and the second parallel matching block, wherein the first parallel matching block is configured to cause a connection point with the series matching block to be in an open state for a radio-frequency signal of a first frequency, wherein the second parallel matching block is configured to cause the connection point with the first parallel matching block to be in a shunted state for a radio-frequency signal of the first frequency, wherein the main-matching block and the series matching block are configured so that an impedance at one end of the series connection matches the impedance of the other end thereof at the first frequency, and wherein the main-matching block and the sub-matching block are configured so that the impedance at one end of the series connection matches the impedance of the other end thereof at a second frequency which is different from the first frequency.

In the above matching circuit, since the connection point of the series matching block and the first parallel matching block is caused to be in an open state for a radio frequency signal of the first frequency, the signal of the first frequency is not affected by the presence of the parallel matching network for a radio frequency signal. That is, when the radio frequency is the first frequency, the main-matching block and the series matching block cooperatively effect impedance matching. On the other hand, when the radio frequency is the second frequency, which is different from the first frequency, the main-matching block and the sub-matching block cooperatively effect impedance matching.

In the above matching circuit, the following configuration may be employed. Supposing that the impedance at one end of the matching circuit is an impedance $Z_f(f)$ dependent on a frequency f, the impedance of the other end of the matching circuit is an impedance $Z_0$ independent of the frequency f, and the first and second frequencies are represented by $f_1$ and $f_2$, respectively, the main matching block is configured to effect impedance matching between an impedance $Z_f(f_1)$ and the impedance $Z_0$ at the first frequency $f_1$ and to convert an impedance $Z_f(f_2)$ into a given impedance $Z(f_2)$ at the second frequency $f_2$, and the sub-matching blocking is configured to keep a matched state between the impedance $Z_f(f_1)$ and the impedance $Z_0$ at the first frequency and to effect impedance matching between the impedance $Z_0$ and the impedance $Z(f_2)$ at the second frequency $f_2$.

In the above configuration, the main-matching block effects matching between the impedance $Z_f(f_1)$ and the impedance $Z_0$ at the first frequency $f_1$. That is, the main-matching block substantially effects impedance matching to be attained by the matching circuit at the first frequency $f_1$. In this process, the main-matching block serves as an impedance converter at the second frequency $f_2$ which is different from the first frequency.

In addition, the series matching block may be a transmission line which has a characteristic impedance same as the impedance $Z_0$, and the series matching block is formed of a transmission line of a predetermined length and the third parallel matching block has a predetermined reactance value so that the sub-matching block effects impedance matching between the impedance $Z_0$ and the impedance $Z(f_2)$ at the second frequency $f_2$.

In the above configuration, by constructing the series matching block as a transmission line of the characteristic impedance $Z_0$, the line length may be arbitrarily set at the first frequency. This also makes it possible to set the length of the transmission line of the series matching block and the reactance value of the third parallel matching block, at the second frequency $f_2$, which is different from the first frequency, without changing the matching condition at the first frequency.

Alternatively, the second frequency $f_2$ is allowed to selectively take one of N predetermined frequencies, where N is an integer of 2 or greater, the series matching block is operable to select and set an arbitrary impedance conversion quantity selected from one or more of predetermined impedance conversion quantities, the third parallel matching block is operable to select and set an arbitrary reactance value selected from one or more predetermined reactance values, there are at least N combinations of the impedance conversion quantity and the reactance value that can be selected, where the N second frequencies $f_2$ correspond to the N combinations on a one-to-one basis, and the sub-matching block is configured to effect impedance matching between the impedance $Z_0$ and the impedance $Z(f_2)$, by setting the impedance conversion quantity and the reactance value of the combination corresponding to the second frequency $f_2$ to the series matching block and the third parallel matching block.

In the above configuration, the series matching block is capable of setting any one of one or more impedance conversion quantities, the third parallel matching block is capable of setting any one of one or more reactance values, there are at least N combinations that can be selected from the impedance conversion quantities and the reactance values, and the above combinations correspond to the second frequencies, on a one-to-one basis. The combination of the impedance conversion quantity and the reactance value corresponding to the second frequency $f_2$, which is different from the first frequency, is set in the series matching block and the third parallel matching block, respectively. It is therefore possible to configure the matching circuit capable of effecting impedance matching simultaneously or selectively for a signal of the first frequency $f_1$ by the main-matching block and the series matching block, and for a signal of arbitrarily selected one of N second frequencies $f_2$ which are different from the first frequency.

It is also possible to configure the matching circuit, as will be described below, capable of effecting impedance matching simultaneously or selectively for a signal of the first frequency $f_1$ from the N+1 frequencies, where N is 2 or greater, and a signal of the second frequency $f_2$, which is arbitrarily selected from the remaining N frequencies.

A matching circuit according to another aspect of the present invention, comprising: a main-matching block which performs impedance matching; and N sub-matching blocks which perform impedance matching for N frequencies, respectively, where N is an integer of 2 or greater. The main-matching block and the N sub-matching blocks are connected in series with a signal path of a radio-frequency signal. Each of the N sub-matching blocks comprises: a series matching block connected in series with the signal path; a switch connected to the series matching block on the side opposite from the main-matching block; and a parallel matching network connected in parallel with the signal path via the switch. The parallel matching network comprises: a first parallel matching block connected to the series matching block via the switch; a second parallel matching block connected to the first parallel matching block on the side opposite from the switch; and a third parallel matching block connected to a connection point of the first parallel matching block and the second parallel matching block. The first parallel matching block is configured to set a connection point with the series matching block via the switch to an open state for a radio-frequency signal at a first frequency which is different from said N frequencies. The second parallel matching block is configured to set the connection point with the first parallel matching block to a shunted state for the radio-frequency signal at the first frequency. A series connection of the main-matching block and the series matching blocks of the N sub-matching blocks are configured so that at the first frequency, an impedance at one end of the series connection matches an impedance at the other end thereof. At a second frequency selected as one of said N second frequencies by setting the switch of corresponding one of said N sub-matching blocks to an ON state, impedances are matched each other at one end and the other end of a series connection of the corresponding N sub-matching block, the main-matching block and the series matching blocks of the sub-matching blocks, if any, on the signal path between said corresponding sub-matching block and the main-matching block.

In the above matching circuit, the following configuration may be employed. When the impedance of one end of the matching circuit is an impedance $Z_T(f)$ dependent on a frequency f, the impedance of the other end of the matching circuit is an impedance $Z_0$ independent of the frequency f, and the first frequency and selected one of N second frequencies are represented as $f_1$ and $f_2$, respectively, the main-matching block is configured to effect impedance matching between an impedance $Z_T(f_1)$ and the impedance $Z_0$ at the first frequency $f_1$ and to convert an impedance $Z_T(f_2)$ into a given impedance $Z(f_2)$ at the second frequency $f_2$, and the sub-matching block corresponding to the switch having been set to an ON state is configured to keep the impedance-matched state between the impedance $Z_T(f_1)$ and the impedance $Z_0$ at the first frequency and to effect impedance matching between the impedance $Z(f_2)$ and the impedance $Z_0$ at the second frequency $f_2$.

In addition, each series matching block of the sub-matching blocks is a transmission line which has a characteristic impedance same as the impedance $Z_0$, and the switch in the sub-matching blocks using for matching at the selected second frequency $f_2$ is set to an ON state, the length of the transmission line of the series matching block and the reactance value of the third parallel matching block in the sub-matching block using for matching at the selected second frequency $f_2$ are set so that the sub-matching block effects impedance matching between the impedance $Z(f_2)$ and the impedance $Z_0$ at the second frequency $f_2$.

Furthermore, a dual-band power amplifier according to yet another aspect of the present invention has the following configuration. A dual-band power amplifier comprises: a matching circuit according to any one of the foregoing aspects of the invention or their modifications; and an amplification device in series with the matching circuit, wherein a radio frequency signal of the first frequency $f_1$ and the signal of the second frequency $f_2$, which is different from the first frequency $f_1$, are amplified simultaneously or selectively.

BEST MODE FOR CARRYING OUT THE INVENTION

Figure 1:
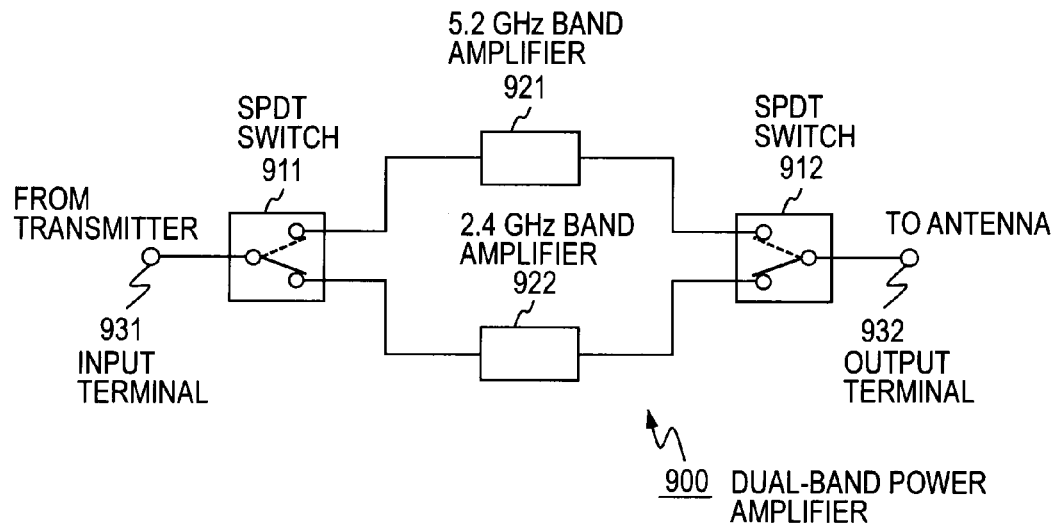
FIG. 1 illustrates an example of the circuit configuration generally employed for a power amplifier (dual-band power amplifier) that is capable of amplifying each of the signals of two frequency bands.
Figure 2:
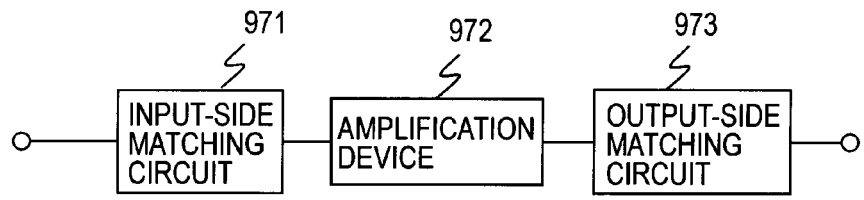
FIG. 2 illustrates an example of the configuration of an amplifier included in the dual-band power amplifier of FIG. 1.

Hereinafter, embodiments of the present invention will be described with reference to the accompanying drawings.

Corresponding components in each of the drawings will be given similar reference numerals and overlapping description thereof will be omitted.

FIRST EMBODIMENT

Figure 3:
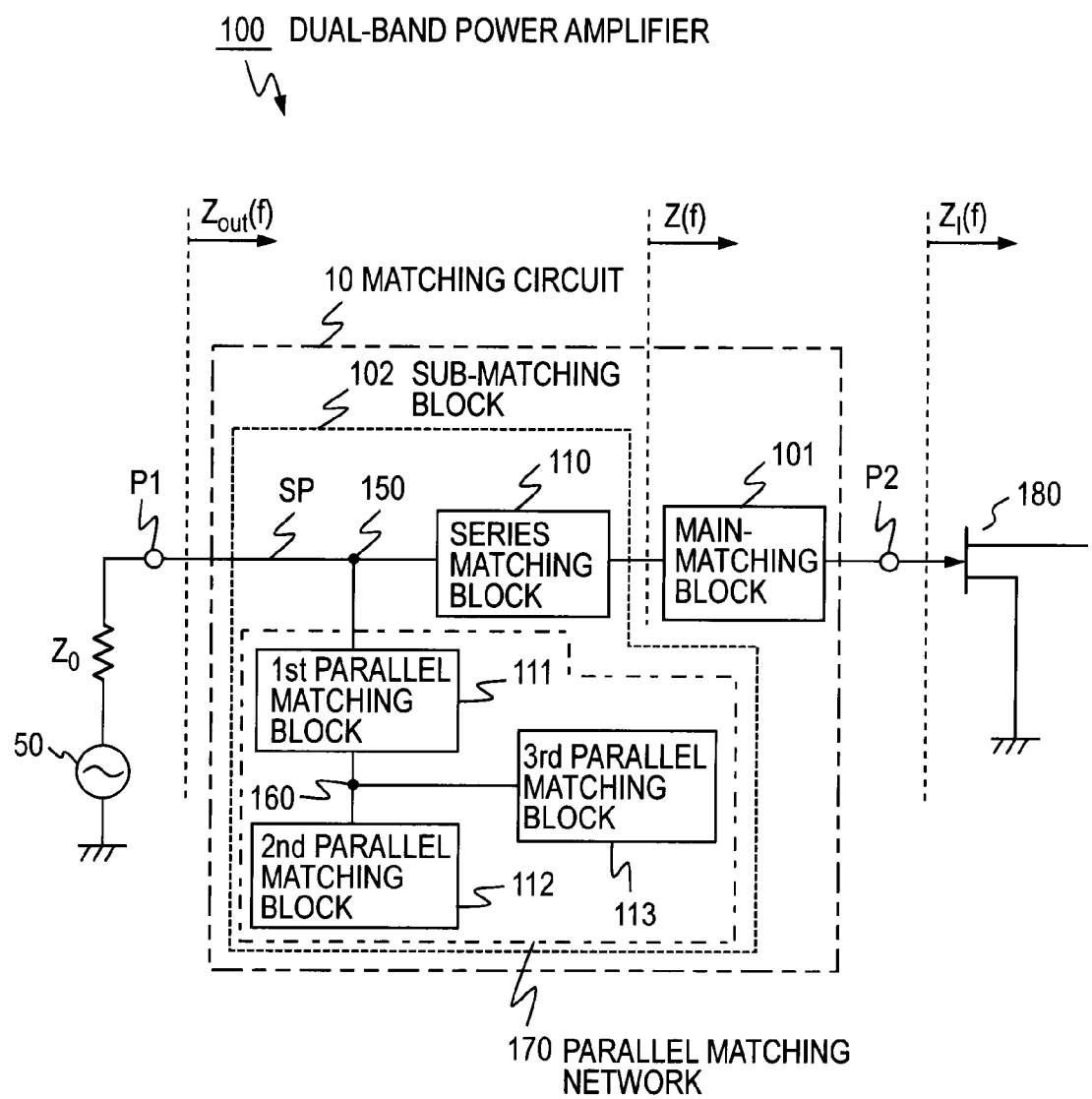
FIG. 3 illustrates a block diagram of a dual-band power amplifier 100 that includes a matching circuit 10 according to the first embodiment of the present invention.

FIG. 3 illustrates a matching circuit 10 according to the first embodiment. FIG. 3 also illustrates the configuration of an input-side circuit of a dual-band power amplifier 100 which can amplify signals of the two frequency bands of FIG. 14 selectively or simultaneously. The first embodiment is an example where the matching circuit 10 is used on the input terminal side of an amplification device 180. In this context, "can amplify selectively" means that even when either one of the signals of two frequency bands is inputted, it is possible to amplify the signal. "can amplify simultaneously" means that signals of two frequency bands are inputted at the same time, in other words, a combined signal of the two frequency bands can be amplified in the respective frequency bands simultaneously. The same applies to the following description.

Generally, matching circuits are those for establishing matching between different impedances. An example thereof is to perform impedance matching between the amplification device 180 such as a Field Effect Transistor (FET) that actually amplifies the signal, and peripheral circuits thereof. The impedances of the input and output of the peripheral circuits are generally adjusted to a certain constant value $Z_0$ (for example, 50 Ω or 75 Ω). Hereinafter, the impedance $Z_0$ will be referred to as "system impedance". In the circuit configuration of FIG. 3, the system impedance corresponds to the impedance $Z_0$ of a radio frequency signal source 50. The matching circuit 10 establishes matching between the output impedance $Z_0$ of the radio frequency signal source 50 and the input impedance of the amplification device 180.

Examples of the amplification device 180 can be a transistor, FET, Metal Oxide Semiconductor FET (MOSFET), Thin Film Transistor (TFT), etc. In each of the drawings hereinafter explained, an n-channel junction type FET is illustrated as an amplification device 180. However, the present invention is not limited to the n-channel junction type FET, and it is only an example of the amplification device 180.

Figure 4:
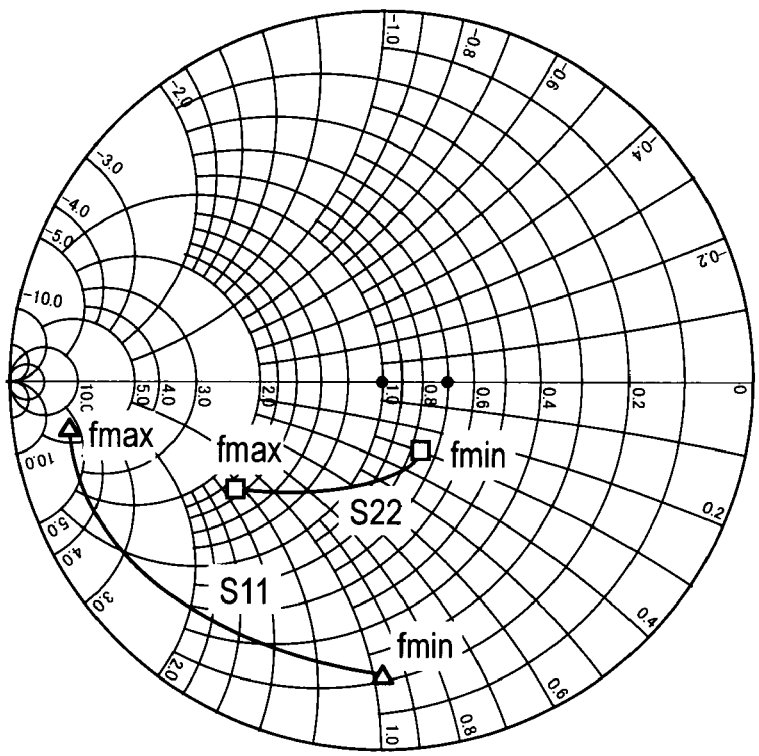
FIG. 4 illustrates frequency characteristics of input and output impedances of an amplifying element.

FIG. 4 illustrates scattering parameters (S parameters) of input and output of the amplification device 180 used in the amplifier, where the upper limit of the measuring frequency is $f_{max}$ and the lower limit thereof is $f_{min}$. In the above example, S11 indicates an input reflection coefficient of the amplification device 180 in a case where the output terminal is terminated with 50 Ω and S22 indicates an output reflection coefficient of the amplification device in a case where the input terminal is terminated with 50 Ω. The input and output impedances of the amplification device 180 are obtainable by using the above reflection coefficients and Smith Chart. As is apparent from FIG. 4, the input and output impedances of the amplification device 180 have frequency characteristics, and the values thereof can be determined from the S parameters and the system impedance $Z_0$. Hence, the input impedance of the amplification device 180, for example, will be expressed by a function $Z_f(f)$ as the input impedance dependent on frequency f. That is to say, the impedance on the amplification device 180 side observed from a terminal (P2) is $Z_f(f)$. Likewise, the output impedance of the amplifying element 180 can be expressed by a function $Z_0(f)$ as the output impedance dependent on frequency f. In, particular, $Z_f(f)$ will be described below.

When designing the dual-band power amplifier 100 capable of amplifying signals in two frequency bands selectively or simultaneously, the impedance matching is necessary between the input impedance $Z_f(f)$ of the amplification device 180 and the system impedance $Z_0$, at the two frequencies where $f=f_1$ and $f_2$. Therefore, the matching circuit 10 has to be such one that effects impedance matching between the input impedance $Z_f(f_1)$ of the amplification device 180 and the system impedance $Z_0$ as well as impedance matching between the input impedance $Z_f(f_2)$ of the amplification device 180 and the system impedance $Z_0$, selectively or simultaneously.

The matching circuit 10 according to the first embodiment includes a main-matching block 101 and a sub-matching block 102. The main-matching block 101 and the sub-matching block 102 are connected in series in a signal path SP along which signals supplied from the radio frequency signal source 50 travel in a direction toward the amplification device 180. The sub-matching block 102 includes a series matching block 110 and a parallel matching network 170. The parallel matching network 170 includes a first parallel matching block 111, a second parallel matching block 112 and a third parallel matching block 113. The parallel matching network 170 is connected in parallel with the signal path SP.

Herein, "matching block" refers to a component of a matching circuit regardless of series or parallel connection, and represents a circuit composed of a transmission line, a lumped element, or combination thereof, or plural transmission lines, plural lumped elements, or combination thereof. In the above context, the lumped elements broadly refer to two-terminal elements such as resistors, capacitors, linear elements like coil, non-linear diodes, etc., so there are no particular limitations thereto.

The following is the gist of the matching circuit 10 according to the first embodiment. Firstly, with regard to the first frequency $f_1$, matching is effected between impedance $Z_f(f_1)$ of the amplification device 180 and the system impedance $Z_0$ by the main-matching block 101 and the series matching block 110 in a state where there is no influence exerted by the parallel matching network 170 (that is, the parallel matching network 170 is separated in view of the impedance at the frequency of the traveling signal) so that the sum of the impedance $Z(f_1)$, which is observed from the connection point of the main-matching block 101 and the sub-matching block 102 toward the main-matching block, and the impedance of the series matching block 110 becomes $Z_0$. In this scheme, for instance, $Z(f_1)$ may be made equal to $Z_0$ by the main-matching block 101 and the sub-matching block 102 may be configured as a circuit for keeping matching between the system impedance $Z_0$ and the impedance $Z(f_1)$ (which is equal to $Z_0$). That is, the impedance $Z_{out}(f_1)$ observed from a terminal P1 toward the sub-matching block 102 is $Z_0$.

Next, with regard to the second frequency $f_2$, the main-matching block 101 functions as an impedance converter for the impedance $Z_f(f_2)$ of the amplification device 180. The sum of the impedance observed from the connection point of the main-matching block 101 and the sub-matching block 102 toward the main-matching block 101 is $Z(f_2)$. In general, it is assumed that $Z(f_2) \neq Z_0$ may hold. The sub-matching block 102 is made to serve as a circuit which effects, by the series matching block 110 and the parallel matching network 170, matching between the system impedance $Z_0$ and the impedance $Z(f_2)$. That is to say, the impedance $Z_{out}(f_2)$ observed from the terminal P1 toward sub-matching block 102 is made equal to $Z_0$ by impedance matching using the sub-matching block 102.

The main-matching block 101 and the sub-matching block 102 may be any blocks as long as they function as stated above. The matching circuit 10 according to the first embodiment substantially achieves the above function in the sub-matching block 102. Hence, the circuit configuration of the sub-matching block 102 will be the main focus of the following.

The main-matching block 101 and the series matching block 110 are connected in series with the amplification device 180, namely, connected in series with the signal path SP described previously. Due to the main purpose of the first embodiment, the main-matching block 101 is located on the side closer to the amplification device 180 than the series matching block 110.

The first parallel matching block 111 is connected to the series matching block 110 on the side opposite from the main-matching block 101, and is connected in parallel with the amplification device 180, namely, in parallel with the above-described signal path SP. The second parallel matching block 112 is connected to the first parallel matching block 111 on the side opposite from the series matching block 110. Further, the third parallel matching block 113 is connected to a connection point 160 of the first parallel matching block 111 and the second parallel matching block 112.

Regarding the second frequency $f_2$, the matching circuit 10 effects impedance matching between the input impedance $Z_f(f_2)$ of the amplification device 180 and the system impedance $Z_0$ by the entire circuit composed of the main-matching block 101 and the sub-matching block 102 that includes the series matching block 110, the first parallel matching block 111, the second parallel matching block 112 and the third parallel matching block 113.

On the other hand, regarding the first frequency $f_1$, the matching circuit 10 is configured to perform impedance matching between the input impedance $Z_f(f_1)$ of the amplification device 180 and the system impedance $Z_0$ through the effect of the main-matching block 101 and the series matching block 110 in a state where the parallel matching network 170 is isolated from the signal path SP in view of the impedance at the first frequency $f_1$.

To this end, the second parallel matching block 112 is designed so that the connection point 160 of the first parallel matching block 111 and the second parallel matching block 112 shunts the radio frequency signal of the first frequency f, and at the same time, the first parallel matching block 111 is designed to be open for the radio frequency signal at the first frequency $f_1$ at the connection point of the series matching block 110 and the first parallel matching block 111. It is to be noted that the third parallel matching block 113 is connected to the connection point 160 where a radio frequency signal of the first frequency $f_1$ is shunted. With such a configuration, the first parallel matching block 111, when viewed from the connection point 150, is considered to be isolated in view of the impedance at the first frequency $f_1$.

That is to say, when the matching circuit 10 is designed as above stated, the first parallel matching block 111, the second parallel matching block 112, and the third parallel matching block 113 do not influence the signal transmission at the first frequency $f_1$. The impedance matching is effected only by the main-matching block 101 and the series matching block 110. For the signal transmission at the second frequency $f_2$, the first parallel matching block 111, the second parallel matching block 112, and the third parallel matching block 113 are not isolated, so the whole matching circuit 10 effects impedance matching. It is therefore possible to perform impedance matching on a combined signal of the two signals in the two frequency bands. It should be appreciated that the matching circuit 10 is the circuit capable of performing impedance matching for a signal in each of different frequency bands. Consequently, the dual-band power amplifier 100 equipped with the matching circuit 10 is capable of functioning as a dual-band power amplifier capable of amplifying signals in two frequency bands selectively or simultaneously.

In addition, the series matching block 110 provides design parameters of the matching circuit 10 in each case of the first frequency f, and the second frequency $f_2$. To put in other words, there is a need for the series matching block 110 to be designed for a desired operation according to each case of the first frequency $f_1$ and the second frequency $f_2$. It would therefore seems difficult to design the series matching block 110, and it would also seem difficult to design the matching circuit 10 accordingly, whereas this is not the case.

For instance, by configuring the matching circuit such that the main-matching block 101 converts the impedance $Z_f(f_1)$ into the impedance $Z_0$ and the series matching block 110 is formed as a transmission line with the characteristic impedance $Z_0$, it is possible to set an arbitrary electric length to the transmission line of the series matching block 110 for impedance matching at the first frequency $f_1$. It is therefore possible to design, for the second frequency $f_2$, the electric length of the series matching block 110 and the reactance value of the third parallel matching block 113 without changing the matching condition for the first frequency $f_1$, thereby certainly enabling to configure the matching circuit 10 at the second frequency $f_2$.

Figure 5:
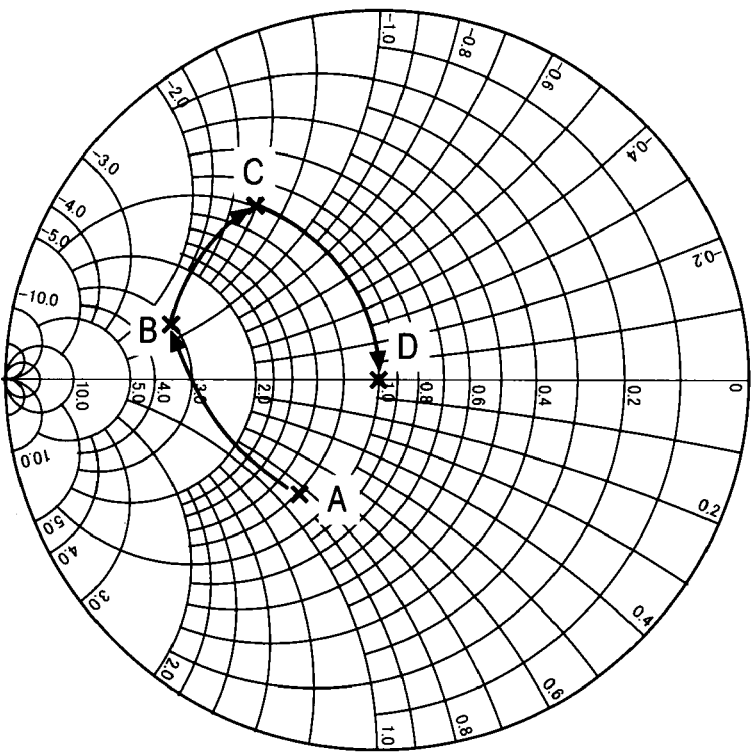
FIG. 5 illustrates the configuration whereby matching is achieved in a second frequency.

In the Smith Chart shown in, for example, FIG. 5, it is assumed that the point A represents the conductance corresponding to the input impedance $Z_f(f_2)$ of the amplification device 180 at the second frequency $f_2$. In this case, since a certain quantity of impedance conversion is effected by the main-matching block 101 in which the settings for the first frequency $f_1$ have been finished, it is also assumed that the impedance corresponding to the impedance $Z(f_2)$ observed from a connection point of the series matching block 110 and the main-matching block 101 toward the main-matching block 101 is moved to a certain point B. Then, by adjusting the electric length (i.e., the corresponding line length accordingly) of the series matching block 110, which is a transmission line with the characteristic impedance $Z_0$, it is possible to move the impedance along the circle with a radius of constant VSWR centered at $Y=(1, 0)$ (point D) to the point C that intersects with the constant conductance circle passing through $Y=(1, 0)$.

Next, the impedance can be moved from the point C to the point D (the position of the characteristic impedance) where $Y=(1, 0)$, along the constant conductance circle, by setting the reactance of the parallel matching network 170. That is to say, matching with the amplification device 180 can be established by the matching circuit 10 also at the second frequency $f_2$. The reactance conversion to the point D by means of the parallel matching network 170 can be achieved by adjusting reactance of the third parallel matching block 113, because the settings have already been done in the first and second parallel matching blocks 111 and 112 for the first frequency $f_1$. To put in other words, it is possible to design the parallel matching network 170 to accomplish matching also at the second frequency $f_2$ without changing the matching state at the first frequency $f_1$.

The third parallel matching block 113 may be arbitrarily composed of an open-circuited line, shorted-circuited line, a lumped element of which one end is grounded, or combinations thereof, according to the design requirements for the matching circuit 10, such as the frequency band to be used. The series matching block 110 may be constructed not only by a transmission line but also by a combination of a transmission line and lumped elements, or may be constructed only by lumped elements.

The second parallel matching block 112 needs to be configured, so that the connection point 160 with the first parallel matching block 111 shunts a radio frequency signal at the first frequency $f_1$. Therefore, the second parallel matching block 112 can be configured as an open-circuited transmission line with an electric length of 90 degrees, i.e., the physical length of, for example, $\lambda_1/4$, where $\lambda_1$ represents the wavelength of the first frequency $f_1$. Also, the first parallel matching block 111 needs to be configured so that the connection point 150 is open for the radio frequency signal at the first frequency $f_1$. This allows the first parallel matching block 111 to be configured as a transmission line with an electric length of 90 degrees (i.e., the physical length is, for example, $\lambda_1/4$). As long as the above conditions are met, the main-matching block 101 may have an arbitrary configuration. Also, the first parallel matching block 111 and the second parallel matching block 112 may be constructed not only by transmission lines but also by some combinations of a transmission line and lumped elements, or may be constructed only by lumped elements.

The description has been given of the case where the matching circuit 10 is provided on the input terminal side of the amplification device 180. However, the matching circuit 10 may be provided on the output terminal side of the amplification device 180, and may be provided on both of the input terminal side and the output terminal side. The structure of the case where the matching circuit is connected to the output terminal side is generally symmetrical, for the amplification device 180, to that of the case where the matching circuit is connected to the input terminal side.

Figure 14:
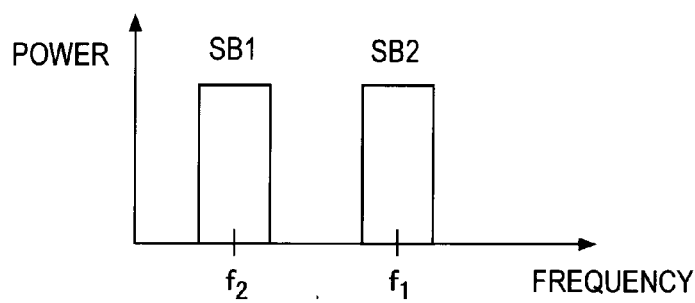
FIG. 14 illustrates the concept of the two frequency bands with center frequencies $f_1$ and $f_2$.

The first embodiment has exemplarily described the dual-band power amplifier 100 capable of amplifying signals in the two frequency bands of FIG. 14 selectively or simultaneously as well as the matching circuit 10 that performs impedance matching on signals in the two frequency bands. In the above description, it is assumed that $f_1 > f_2$ holds for the two frequency bands SB1 and SB2 having the center frequencies of the first frequency $f_1$ and the second frequency $f_2$, respectively, as depicted in FIG. 14. However, the first embodiment is not limited to the case where the higher frequency is designed to be the first frequency $f_1$. That is, even when the higher frequency may be designed to be the second frequency $f_2$ and the lower one may be designed to be the first frequency $f_1$, a similar design can be made.

It is to be noted that when the first parallel matching block 111 and the second parallel matching block 112 are respectively constructed by transmission lines, each of the first parallel matching block 111 and the second parallel matching block 112 can be designed to have a line length of $\lambda_1/4$ so that the connection point 150 should be open and the connection point 160 should shunt the signal of the first frequency $f_1$. Preferably, the higher frequency is designed to be the first frequency $f_1$, so that the line length of the first parallel matching block 111 and that of the second parallel matching block 112 can be made shorter.

SECOND EMBODIMENT

Figure 15:
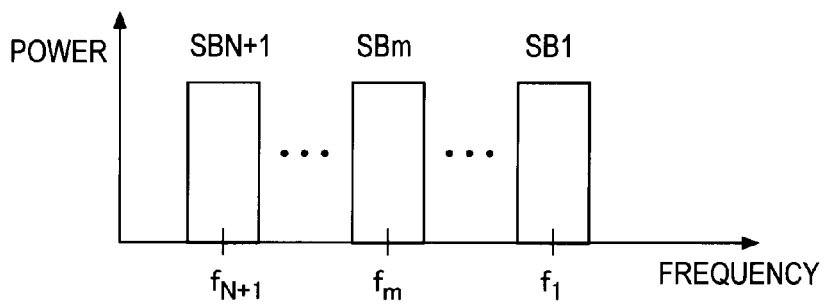
FIG. 15 illustrates the concept of N+1 frequency bands with center frequencies $f_1, \ldots,$ and $f_{N+1}$.

The first embodiment has exemplarily described the dual-band power amplifier 100 capable of amplifying the signals of the two frequency bands selectively or simultaneously as well as the matching circuit 10 that performs impedance matching on the signals of the two frequency bands selectively or simultaneously. The second embodiment, as an expansion of the first embodiment, will exemplarily describe the dual-band power amplifier 100 capable of amplifying two out of N+1 signals of predetermined frequency bands SB1 to SBN+1, where N assumes an integer of 2 or more, as shown in FIG. 15, as well as the matching circuit 10 that performs impedance matching.

In the first embodiment previously described, the electric length of the series matching block 110 configured as a transmission line and the reactance value of the third parallel matching block 113 are designed for the second frequency $f_2$ without changing the matching condition at the first frequency $f_1$. The second embodiment is based upon a technical idea where the first frequency $f_1$ is fixed and the second frequency $f_2$ is variable, so that the matching circuit 10 can be configured to perform impedance matching on one signal of the first frequency $f_1$ among the signals of predetermined N+1 frequencies in N+1 frequency bands and another signal of a frequency arbitrarily selected from the remaining second to the (N+1)th frequencies $f_2$ to $f_{N+1}$, selectively or simultaneously.

Figure 6:
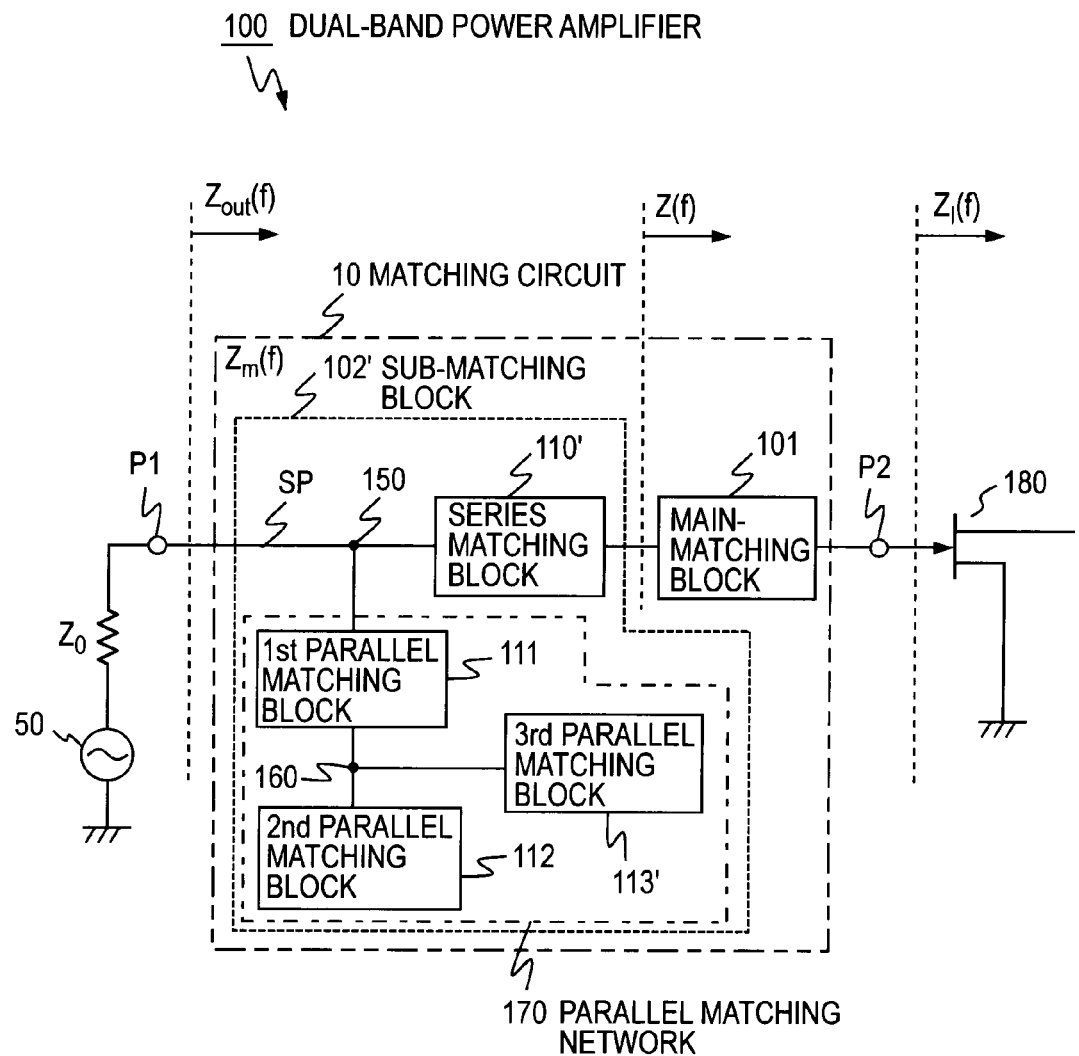
FIG. 6 illustrates a block diagram of the matching circuit 10 and the dual-band power amplifier 100 according to the second embodiment of the present invention.

Referring now to FIG. 6, in the matching circuit 10 according to the second embodiment, the series matching block 110 discussed in the first embodiment is replaced by a series matching block 110' and the third parallel matching block 113 discussed in the first embodiment is replaced by a third parallel matching block 113'. In the second embodiment, the impedance conversion quantity of the series matching block 110' and the reactance value of the third parallel matching block 113' are designed for each qth frequency $f_q$ where q represents an integer between 2 and N+1, both inclusive, without changing the matching condition at the first frequency $f_1$. The dual-band power amplifier 100 according to the second embodiment is constructed to contain the aforementioned matching circuit 10.

Figure 7:
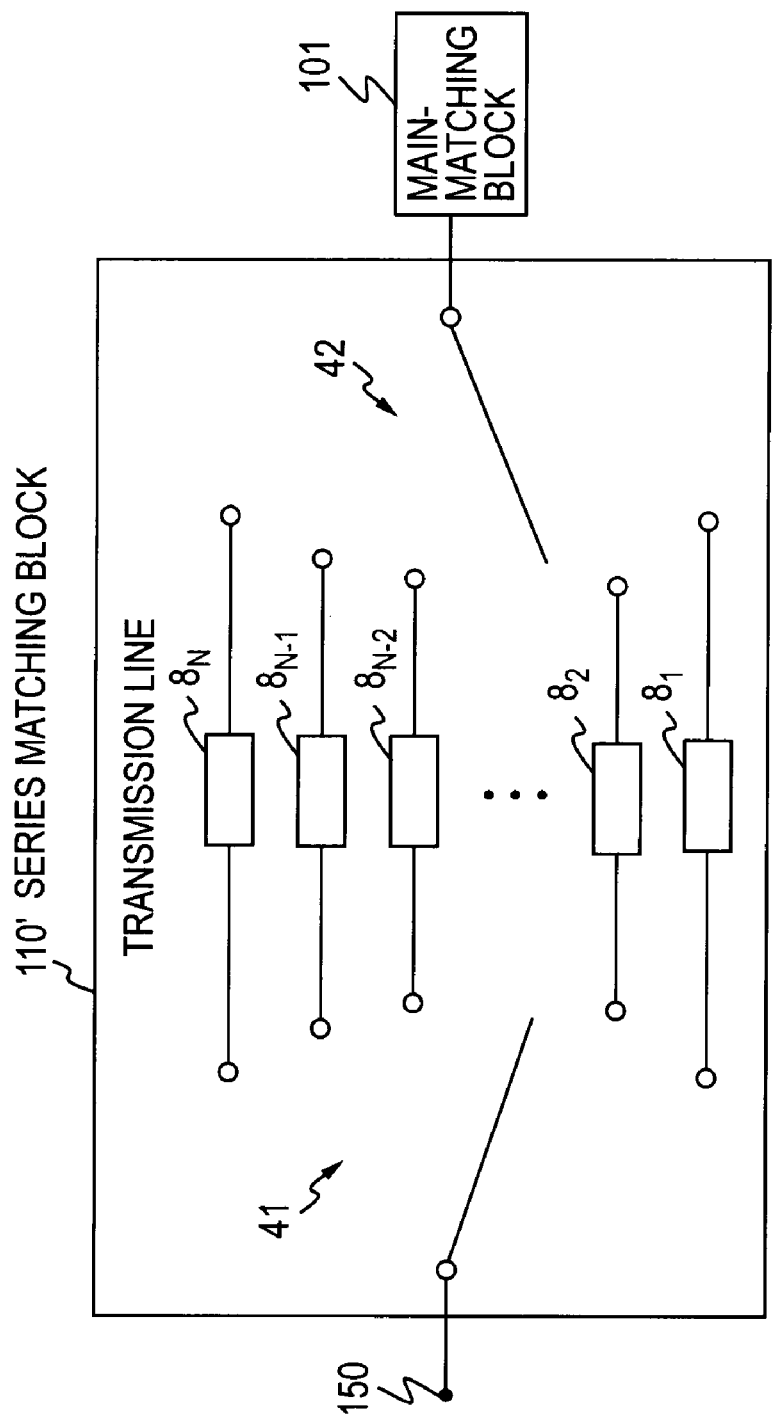
FIG. 7 illustrates an example of the configuration of a series matching block in the second embodiment of the present invention.

FIG. 7 specifically illustrates the configuration example of the series matching block 110'. The series matching block 110' can be constructed of one-input N-output switches 41 and 42, which are changing-over switches, and at most N transmission lines $8_1$-$8_N$. Each of the transmission lines $8_1$-$8_N$ has the characteristic impedance $Z_0$ so as not to destroy the matching condition at the first frequency $f_1$. Also, the electric lengths of the transmission lines $8_1$-$8_N$ are different from one another. In this example, N transmission lines $8_1$-$8_N$ are arranged in rows. One end of the switch 41 is connected to the connection point 150.

One end of the switch 42 is connected to the main-matching block 101. The same transmission line $8_n$ (where n assumes an integer between 1 and N, both inclusive) is selected by the other ends of the switches 41 and 42. The selection and the reason why there are at most N transmission lines will be explained in detail subsequent to the description of the third parallel matching block 113'.

Figure 8:
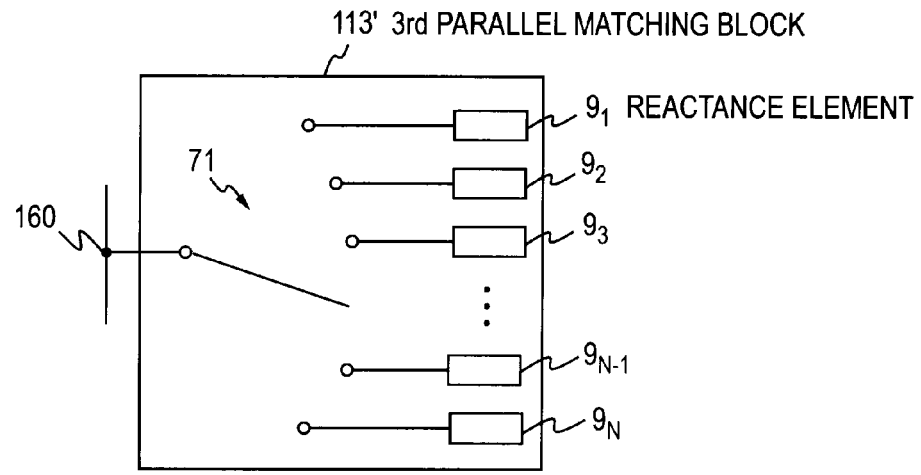
FIG. 8 illustrates an example of the configuration of a third parallel matching block in the second embodiment of the present invention.
Figure 9:
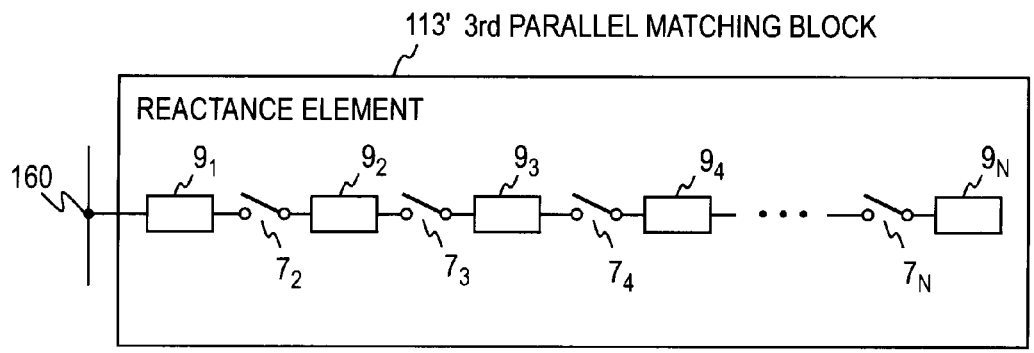
FIG. 9 illustrates another example of the configuration of the third parallel matching block in the second embodiment of the present invention.
Figure 10:
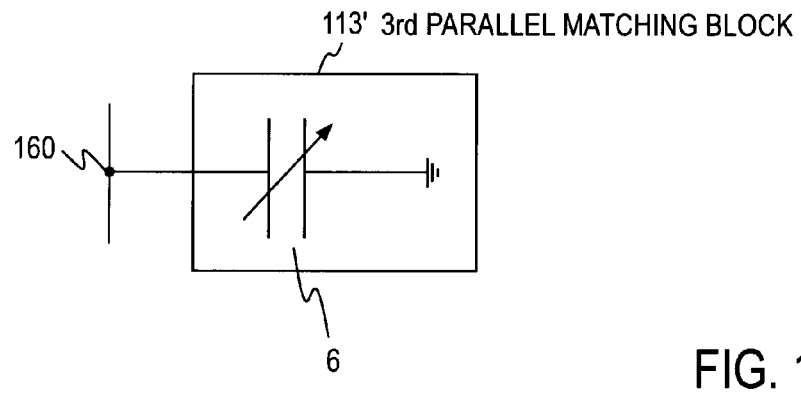
FIG. 10 illustrates yet another example of the configuration of the third parallel matching block in the second embodiment of the present invention.

FIG. 8, FIG. 9, and FIG. 10, specifically illustrate three configuration examples of the third parallel matching block 113'. Referring now to FIG. 8, the third parallel matching block 113' can be configured with a one-input N-output switch 71, which is a change-over switch, and at most N reactance elements $9_1$-$9_N$. In this example, reactance elements $9_1$-$9_N$, which have reactance values different from one another, are arranged in rows. One end of a switch 71 is connected to the connection point 160. One reactance element is selected by the other end of the switch 71. It should be appreciated that transmission line, coil, capacitor, etc. are concrete examples of the reactance element.

Referring now to FIG. 9, plural combinations of switches and reactance elements in cascade may be employed as another specific configuration of the third parallel matching block 113'. In the above configuration, at most N reactance elements $9_1$-$9_N$, which have reactance values different from one another, and at most N−1 switches $7_2$-$7_N$ are alternately arranged in cascade connection. That is, one end of the reactance element $9_1$, which is located at one end of the cascade connection, is connected to the connection point 160. The other end of the reactance element $9_1$, which is opposite from the connection point 160, is connected to one end of a switch $7_2$. Also, one end of the reactance element $9_N$, which is located at the other end of the cascade connection, is connected to a switch $7_N$. One end of each reactance element $9_x$ is connected to a switch $7_x$, and the other end of the reactance element $9_x$ is connected to a switch $7_{x+1}$, provided that x=2, 3, ..., N−1. With such a configuration, it is possible to design the switches $7_2$-$7_y$ to be in an ON state and a switch $7_{y+1}$ to be in an OFF state for the (y+1)th frequency $f_{y+1}$. In a case where y=1, the switch $7_2$ is designed to be in an OFF state. This makes available N reactance values at a maximum by changing the state of the switches $7_2$-$7_N$.

Alternatively, referring now to FIG. 10, a variable reactance means capable of changing the reactance value may be employed as another specific configuration of the third parallel matching block 113'. In this case, a variable capacitor 6 whose capacitance is variable, for example, may be applied to the variable reactance means. In the configuration illustrated in FIG. 10, one end of the variable capacitor 6 is connected to the connection point 160, and the other end thereof is grounded. For example, at most N reactance values are available by causing the variable capacitor 6 to be one of predetermined N reactance values.

In the second embodiment, the impedance conversion quantity of the series matching block 110' and the reactance value of the third parallel matching block 113' are designed for each qth frequency $f_q$ ($2 \leq q \leq N+1$) as stated above. To put in other words, a combination of an impedance conversion quantity of the series matching block 110' and a reactance value of the third parallel matching block 113' corresponds to each qth frequency $f_q$ on a one-to-one basis. Accordingly, for example, in a case where the series matching block 110' is configured as shown in FIG. 7 and the third parallel matching block 113' is configured to be any one of the configurations of FIG. 8 to FIG. 10, it is sufficient that there are N combinations of an electric length of the transmission line in the series matching block 110' and a reactance value of the third parallel matching block 113'. For this reason, it is possible to set the number of different electric lengths of the transmission lines included in the series matching block 110' to N or less, and set the number of the reactance values of the third parallel matching block 113' to N or less. As a specific example, it is assumed that N=4, there are two transmission lines included in the series matching block 110' and the electric lengths thereof are a and b (a≠b), and there are two reactance values of the third parallel matching block 113' that are c and d (c≠d). Four combinations (a, c), (b, c), (a, d), and (b, d) are obtainable, so each combination can be designed to correspond to each qth frequency $f_q$ (2≦q≦5) in some cases.

When designing as stated above, it is assumed that the impedance matching is performed on the signal of the frequency $f_1$ and the signal of the qth frequency $f_q$ selectively or simultaneously, in other words, the signal of the first frequency $f_1$ and the signal of the qth frequency $f_q$ are amplified selectively or simultaneously. If the combination of an electric length A of the transmission line and a reactance value B of the third parallel matching block 113' corresponds to the qth frequency $f_q$, the transmission line with the electric length A is selected by switching the switches 41 and 42 in the series matching block 110'. Also, when the third parallel matching block 113' has the configuration of FIG. 8, the reactance element of the reactance value B is selected. When the third parallel matching block 113' has the configuration of FIG. 9, predetermined number of the switches are set to an ON state so as to provide the reactance value B. When the third parallel matching block 113' has the configuration of FIG. 10, the value of the variable reactance means is set to have the reactance value B. In addition, when the impedance matching or amplification is performed only on the signal of the first frequency $f_1$, an arbitrary reactance value can be set or selected in the third parallel matching block 113', and also an arbitrary transmission line can be selected in the series matching block 110' having the configuration of FIG. 7. Furthermore, the configurations of the series matching block 110' and the third parallel matching block 113' are not limited to those of FIG. 7 to FIG. 10. For example, a circuit or a circuit element effective to a signal of the first frequency $f_1$ may be provided in addition to the transmission lines $8_1$-$8_N$ in the series matching block 110'. The circuit or the circuit element may be selected, when the impedance matching or amplification is performed only on the signal of the first frequency $f_1$.

As discussed above, the dual-band power amplifier 100 of the second embodiment is capable of amplifying two signals out of signals of three or more frequency bands, selectively or simultaneously. However, it can be said that the dual-band power amplifier 100 can practically handle three or more frequency bands by changing the combination of the impedance conversion quantity of the series matching block 110' and the reactance value of the third parallel matching block 113'. Therefore, it should be understood that the dual-band power amplifier 100 is essentially a multi-band power amplifier. Accordingly, the matching circuit 10 included in the dual-band power amplifier 100 has the capability of performing impedance matching for two signals out of the signals of three or more frequency bands. However, the matching circuit 10 can practically handle three or more frequency bands by switching the combination of the impedance conversion quantity of the series matching block 110' and the reactance value of the third parallel matching block 113'. Therefore, it should be understood that it would essentially be appropriate to refer to the matching circuit 10 as a multi-band matching circuit.

THIRD EMBODIMENT

The third embodiment, as an expansion of the first embodiment but different from the second embodiment, will exemplarily describe the dual-band power amplifier capable of amplifying two signals out of signals of three or more frequency bands, selectively or simultaneously, as well as the matching circuit that performs impedance matching on signals of two frequency bands, selectively or simultaneously.

Figure 11:
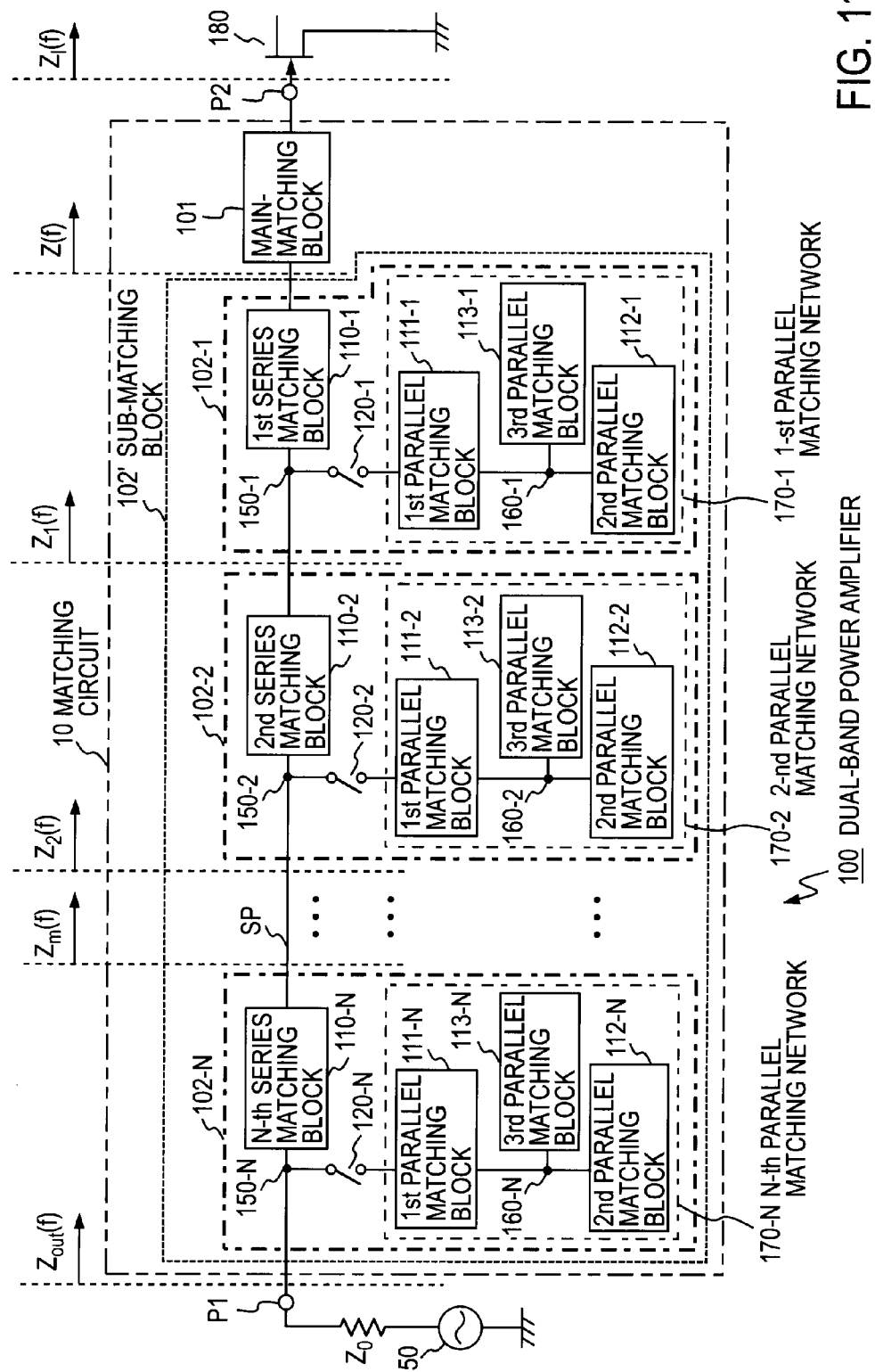
FIG. 11 illustrates a block diagram of the dual-band power amplifier 100 that includes the matching circuit 10 according to the third embodiment of the present invention.

FIG. 11 illustrates the matching circuit 10 according to the third embodiment. FIG. 11 also illustrates the circuit configuration of the dual-band power amplifier 100 capable of amplifying a signal of the first frequency $f_1$ and a signal of another frequency in one of N+1 frequency bands shown in FIG. 15, selectively or simultaneously, where N assumes an integer of 2 or greater. The third embodiment is an example where the matching circuit 10 is used on the input terminal side of the amplification device 180.

The outline of the matching circuit 10 according to the third embodiment is that the sub-matching block 102 discussed in the first embodiment is replaced by a sub-matching block 102' to be described below. The sub-matching block 102' includes first to Nth sub-matching blocks 102-1 to 102-N, which are respectively similar to the sub-matching block 102 discussed in the first embodiment and are connected in series in the signal path SP. In this case, each of the sub-matching blocks 102-n (where n=1, 2, . . . , N), is similar to the sub-matching block 102 in the first embodiment, except that a series matching block 110-n corresponding to the series matching block 110 in the first embodiment and a first parallel matching block 111-n corresponding to the first parallel matching block 111 in the first embodiment are connected via a switch 120-n. The series matching block 110, the first parallel matching block 111, the second parallel matching block 112, the third parallel matching block 113 in the first embodiment correspond to a series matching block 110-n, a first parallel matching block 111-n, a second parallel matching block 112-n, and a third parallel matching block 113-n in the third embodiment, respectively.

It is to be noted that "switch" described herein is not limited to that of a contact type. The switch may be, for example, a so-called switching element that uses a diode, transistor, MOS element, or the like, and that has a function of opening and closing a circuit with no contact point in the circuit. Specific examples thereof are Micro-Electro Mechanical Systems (MEMS) switches and switching diodes.

The main-matching block 101 and the first to the Nth series matching blocks 110-1-110-N are connected in series with an amplification device 180, namely, inserted in series in the signal path SP. The main-matching block 101 is disposed closest to the amplification device 180 as compared to the first through the Nth series matching blocks 110-1 to 110-N.

In the third embodiment, the main-matching block 101 and the first to Nth series matching blocks 110-1-110-N are connected in series, in this order from the amplification device 180 side. Hereinafter, a set of the first parallel matching block 111-n, the second parallel matching block 112-n, and the third parallel matching block 113-n will be referred to as an nth parallel matching network 170-n (where n=1, 2, . . . , N).

In the dual-band power amplifier 100 shown in FIG. 11, when a signal of the first frequency $f_1$ and the signal of the mth frequency $f_m$ in N+1 frequency bands are amplified selectively or simultaneously, in other words, when impedance matching is performed on the signal of the first frequency $f_1$ and the signal of the mth frequency $f_m$ selectively or simultaneously, an (m−1)th switch 120-(m−1) out of the N switches 120-1 to 120-N is caused to be in an ON state and the other switches are caused to be in an OFF state, in the matching circuit 10, where m assumes an integer between 2 and N+1, both inclusive. In addition, when the impedance matching or amplification is performed only on the signal of the first frequency $f_1$, all switches 120-1 to 120-N may be set in an OFF state or any of the switches 120-1 to 120-N may be set in an ON state.

Insertion loss is caused in an ON state in an actual switch. However, even if the number N+1 of the frequency bands is increased, only one of the switches is selectively set to an ON state as required. It is therefore possible to minimize degradation of the characteristics of the matching circuit 10 caused by the insertion loss of the switch. Preferably, each of the switches may have excellent isolation characteristics.

Specifically, when a signal of the first frequency $f_1$ and a signal of the second frequency $f_2$ in the N+1 frequency bands are amplified selectively or simultaneously, the first switch 120-1 is set to an ON state and the other switches are set to an OFF state. Thus, only the first parallel matching network 170-1 is connected in parallel with the signal path SP extending from the radio frequency signal source 50 to the amplification device 180.

In this case, the designs of the main-matching block 101, the first series matching block 110-1, and the first parallel matching network 170-1 are basically the same as those in the first embodiment. That is to say, the second parallel matching block 112-1 is designed such that the connection point 160-1 of the first parallel matching block 111-1 and the second parallel matching block 112-1 should shunt a radio frequency signal of the first frequency $f_1$. The first parallel matching block 111-1 is designed such that the connection point 150-1 should be open for a radio frequency signal of the first frequency $f_1$. In addition, the third parallel matching block 113-1 is connected to the connection point 160-1 where a radio frequency signal of the first frequency $f_1$ is shunted.

As to the second frequency $f_2$, for example, it is necessary to design the electric length of the first series matching block 110-1 constructed as a transmission line and the reactance value of the third parallel matching block 113-1 in an appropriate manner as explained with reference to FIG. 5. In this process, the first parallel matching block 111-1, the second parallel matching block 112-1, and the third parallel matching block 113-1 will not affect the signal transmission at the first frequency $f_1$ for which impedance matching is effected by the main-matching block 101 and the first series matching block 110-1. The impedance $Z(f_1)$ observed from the radio frequency signal source 50 toward the connection point 150-1 becomes $Z_0$. Also, at the second frequency $f_2$, the first parallel matching block 111-1, the second parallel matching block 112-1, and the third parallel matching block 113-1 are not isolated in view of the impedance at the first frequency $f_1$. The impedance matching is effected by the main-matching block 101, the first series matching block 110-1, the first parallel matching block 111-1, the second parallel matching block 112-1, and the third parallel matching block 113-1. The impedance $Z(f_2)$ observed from the radio frequency signal source 50 toward the connection point 150-1 becomes $Z_0$.

The second to the Nth series matching blocks 110-2-110-N are regarded as circuits for keeping matching at f, between the system impedance $Z_0$ and the impedance $Z_f(f_1)$ observed from the radio frequency signal source 50 toward the connection point 150-1. Specifically, for example, each of the second to the Nth series matching blocks 110-2-110-N can be configured as a transmission line of the characteristic impedance $Z_0$. In this case, the electric length of each transmission line can be chosen arbitrarily at the first frequency $f_1$ or the second frequency $f_2$. As will be described below, however, the electric length is determined in the design for the third frequency $f_3$, the fourth frequency $f_4$, ..., and the (N+1)th frequency $f_{N+1}$.

Subsequently, when a signal of the first frequency $f_1$ and that of the third frequency $f_3$ in the N+1 frequency bands are amplified selectively or simultaneously, the second switch 120-2 is set to an ON state and the other switches are set to an OFF state. Thus, only the second parallel matching network 170-2 is connected in parallel with the signal path SP between the radio frequency signal source 50 and the amplification device 180.

In this case, the same design as for the case of the frequency $f_2$ can be applied. That is to say, as to the third frequency $f_3$, the impedance matching between the input impedance $Z_f(f_3)$ of the amplification device 180 and the system impedance $Z_0$ is effected by a circuit composed of the main-matching block 101, the first series matching block 110-1, the second series matching block 110-2, the first parallel matching block 111-2, the second parallel matching block 112-2, and the third parallel matching block 113-2.

On the other hand, as to the first frequency $f_1$, the impedance matching between the input impedance $Z_f(f_1)$ of the amplification device 180 and the system impedance $Z_0$ is effected by the main-matching block 101, the first series matching block 110-1, and the second series matching block 110-2. For this reason, the second parallel matching block 112-2 is designed such that the connection point 160-2 of the first parallel matching block 111-2 and the second parallel matching block 112-2 should shunt a radio frequency signal of the first frequency $f_1$. The first parallel matching block 111-2 is designed such that the connection point 150-2 of the second series matching block 110-2 and the first parallel matching block 111-2 should be open for the radio frequency signal of the first frequency $f_1$. In addition, the third parallel matching block 113-2 is connected to the connection point 160-2, which shunts the radio frequency signal of the first frequency $f_1$.

Such a design allows the parallel matching network 170-2 to be regarded as isolated from the signal path in view of the impedance at the first frequency $f_1$. Additionally, as to the third frequency $f_3$, for example, it is necessary to design the electric length of the second series matching block 110-2 configured as a transmission line and the reactance value of the third parallel matching block 113-2 in an appropriate manner as explained with reference to FIG. 5. In this process, the electric length of the second series matching block 110-2 configured as a transmission line can be determined to a specific value without changing the matching condition for the first frequency $f_1$. It is to be noted that the electric length of the first series matching block 110-1 configured as a transmission line in the above case has already been designed for the second frequency $f_2$.

The first parallel matching block 111-2, the second parallel matching block 112-2, and the third parallel matching blocks 113-2 in the second parallel matching network 170-2 do not influence the signal transmission at the first frequency $f_1$. Impedance matching is effected for the first frequency $f_1$ by the main-matching block 101, the first series matching block 110-1, and the second series matching block 110-2, so the impedance $Z_2(f_1)$ observed from the radio frequency signal source 50 toward the connection point 150-2 becomes $Z_0$. In addition, for the signal transmission at the third frequency $f_3$, the first parallel matching block 111-2, the second parallel matching block 112-2, and the third parallel matching block 113-2 are not isolated from the signal path in view of the impedance, and impedance matching is effected by the main-matching block 101, the first series matching block 110-1, the second series matching block 110-2, and the first to third parallel matching blocks 111-2, 112-2 and 113-2. The impedance $Z_2(f_3)$ observed from the radio frequency signal source 50 toward the connection point 150-2 becomes $Z_0$.

The same design scheme as described above can also apply to the mth sub-matching block 102-m (where m=3, 4, . . . , N) for the first frequency $f_1$ and the mth frequency $f_m$.

The dual-band power amplifier 100 discussed in the third embodiment is capable of amplifying two signals out of signals in three or more frequency bands selectively or simultaneously. However, the dual-band power amplifier 100 is practically operable for three or more frequency bands by changing the switches. Therefore, it should be understood that the dual-band power amplifier 100 is essentially equivalent to a multi-band power amplifier. Similarly, the matching circuit 10 included in the dual-band power amplifier 100 is also capable of performing matching for two signals out of signals in three or more frequency bands selectively or simultaneously. Since the matching circuit 10 is practically operable for three or more frequency bands by changing the switches, it should be appreciated that the matching circuit 10 is essentially equivalent to a multi-band matching circuit.

Modifications of Second Embodiment and Third Embodiment

In the second embodiment and the third embodiment, the descriptions have been given of the dual-band power amplifier capable of amplifying two signals out of signals of N+1 frequency bands shown in FIG. 15, selectively or simultaneously, as well as the matching circuit that performs impedance matching for dual bands. Here, $f_1 > f_2 > \ldots > f_{N+1}$ is satisfied in the N+1 frequency bands, where the first to the (N+1)th center frequencies of FIG. 15 are $f_1$ to $f_{N+1}$, respectively. The second embodiment and the third embodiment are not limited to designing the first frequency $f_1$, which is the highest frequency, as a principal frequency, which is always selected as one of frequencies in the two frequency bands selected from three or more frequency bands.

In the second embodiment, an arbitrary frequency $f_q$, where q=1, 2, . . . , N+1, can be designed as the principal frequency, under the condition of $f_1 > f_2 > \ldots > f_{N+1}$. In other words, as to the principal frequency, the first parallel matching block 111 and the second parallel matching block 112 may be designed such that the connection point 150 should be in an open state and the connection point 160 should be in a shunted state for the principal frequency signal.

Likewise, in the third embodiment, an arbitrary frequency $f_q$ can be designed as the principal frequency and the first parallel matching block 111-n and the second parallel matching block 112-n in each of the parallel matching network 170-1-170-N need to be designed such that the connection point 150-n should be in an open state and the connection point 160-n should be in a shunted state for the principal frequency signal.

However, for example, when the first parallel matching block 111 and the second parallel matching block 112 discussed in the second embodiment are of transmission lines respectively, or when the first parallel matching block 111-n and the second parallel matching block 112-n in each sub-matching block 102-n discussed in the third embodiment are of transmission lines respectively, it is preferred to design the highest frequency to be a principal frequency (wavelength $\lambda$). In the second embodiment, the first parallel matching block 111 and the second parallel matching block 112 are configured as transmission lines each having a line length $\lambda/4$, so that the first parallel matching block 111 and the second parallel matching block 112 in the sub-matching block 102 cause the connection point 150 to be in an open state and the connection point 160 to be in a shunted state for a radio frequency signal of the principal frequency. This allows each of the line lengths of the first parallel matching block 111 and the second parallel matching block 112 to be made shorter by designing the highest frequency as the principal frequency.

Likewise, the first parallel matching block 111-n and the second parallel matching block 112-n in each sub-matching block 102-n discussed in the third embodiment is designed such that the connection point 150-n is in an open state and the connection point 160-n is in a shunted state for the principal frequency signal. When the first parallel matching block 111-n and the second parallel matching block 112-n are configured as transmission lines each having a line length $\lambda/4$, each of the line lengths of the first parallel matching block 111-n and the second parallel matching block 112-n can be made shorter by designing the highest frequency as the principal frequency.

Multi-Band Operation

In the second embodiment, the third embodiment, and the modifications thereof, specific connection points are designed to be in an open or shunted state for the principal frequency. For this reason, one of the two frequency bands selected from three or more frequency bands is a frequency band having its center frequency at the principal frequency. To put in other words, there are N combinations of the two frequency bands, when selected from N+1 frequency bands.

Thus, in the second embodiment or the modification thereof, a variable circuit that can change the circuit constant thereof may be used for each of the first parallel matching block 111 and the second parallel matching block 112. For example, the circuit constant of each of the matching blocks can be changed by employing a variable element such as a variable capacitor to construct the first parallel matching block 111 and the second parallel matching block 112. Then, by changing the circuit constant of the first parallel matching block 111 and that of the second parallel matching block 112, it is possible to set the connection point 150 to an open state and the connection point 160 in a shunted state for the principal frequency signal. Similarly, in the third embodiment and the modification thereof, a variable circuit that can change the circuit constant thereof may be used for each of the first parallel matching block 111-n and the second parallel matching block 112-n in each sub-matching block 102-n. Then, by changing the circuit constant of the first parallel matching block 111-n and that of the second parallel matching block 112 n, it is possible to set the connection points 150-1 to 150-N to an open state and the connection points 160-1 to 160-N to a shunted state for the principal frequency signal. In this case, the number of the combinations of the two frequency bands, when selected from N+1 frequency bands, is $_{N+1}C_2 = (N+1) \times N/2$.

FOURTH EMBODIMENT

Figure 12:
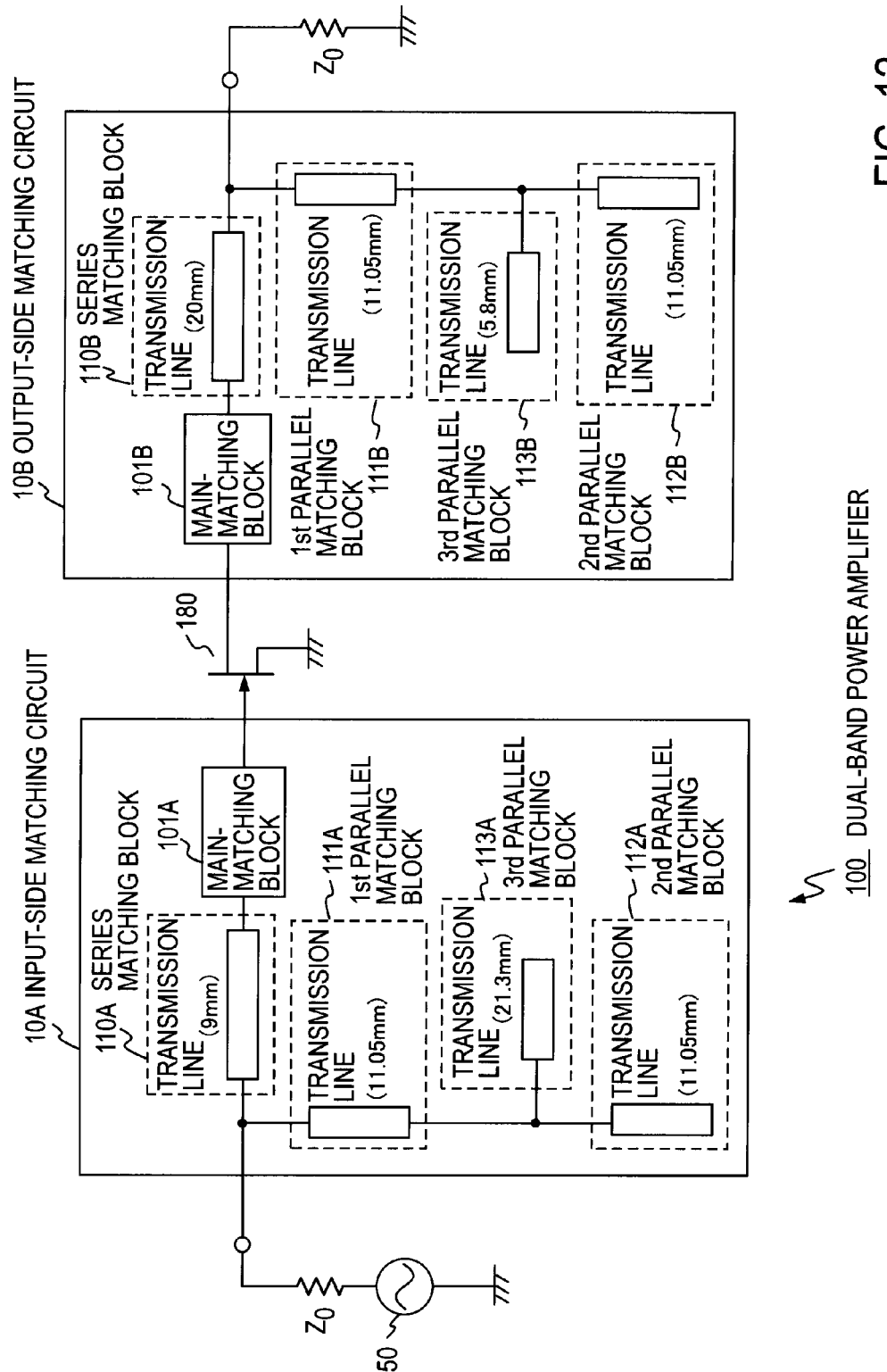
FIG. 12 illustrates a block diagram of the dual-band power amplifier 100 according to the fourth embodiment of the present invention.

FIG. 12 illustrates a specific design example of the dual-band power amplifier 100 for 1.0 GHz and 4.9 GHz. What is shown therein is an example where the matching circuit 10 discussed in the first embodiment is used as an input-side matching circuit 10A on the input terminal side of the amplification device 180 and as an output-side matching circuit 10B on the output terminal side of the amplification device 180. In this case, it is assumed that the first frequency $f_1$ is 4.9 GHz and the second frequency $f_2$ is 1.0 GHz.

In this design example, an input-side matching circuit 10A and an output-side matching circuit 10B are respectively configured such that a series matching block 110A, the first parallel matching block 111A, a second parallel matching block 112A, a third parallel matching block 113A, a series matching block 110B, a first parallel matching block 111B, a second parallel matching block 112B, a third parallel matching block 113B are configured as transmission lines each having the characteristic impedance $Z_0$ (=50 Ω). In addition, both of the main-matching blocks 101A and 101B are configured to be the matching circuits for 4.9 GHz.

Furthermore, the electric lengths of the transmission lines of the first parallel matching block 111A, the second parallel matching block 112A, the first parallel matching block 111B, and the second parallel matching block 112B are 90 degrees at the frequency of 4.9 GHz, that is, $\lambda/4$=11.05 mm (the substrate with the dielectric constant 2.3). Accordingly, in the input-side matching circuit 10A, a connection point of the series matching block 110A and the first parallel matching block 111A is open for a radio frequency signal of the first frequency $f_1$=4.9 GHz, and a connection point of the first parallel matching block 111A, which is connected to the third parallel matching block 113A, and the second parallel matching block 112A is shunted for a radio frequency signal of the first frequency $f_1$. The same applies to the output-side matching circuit 10B.

It is possible to design each of the physical lengths of the transmission lines of the series matching block 110A, the third parallel matching block 113A, the series matching block 10B, and the third parallel matching block 113B in an appropriate manner so as to effect impedance matching in each of the input-side matching circuit 10A and the output-side matching circuit 10B at the second frequency $f_2$=1.0 GHz. In this example, the length of the transmission line in the series matching block 110A is 9 mm and that of the third parallel matching block 113A is 21.3 mm, in the input-side matching circuit 10A. Also, the length of the transmission line in the series matching block 110B is 20 mm and that of the third parallel matching block 113B is 5.8 mm, in the output-side matching circuit 10B.

Figure 13:
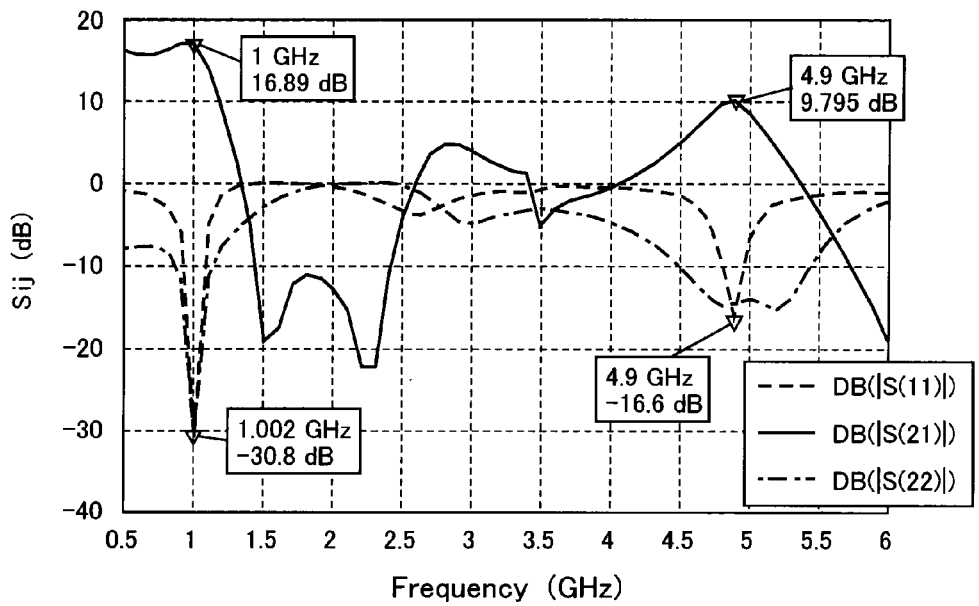
FIG. 13 illustrates the results of simulation for S parameters at a first frequency $f_1$ and a second frequency $f_2$, in the dual-band power amplifier 100 of FIG. 12.

FIG. 13 illustrates the simulation results of the frequency responses for the circuit shown in FIG. 12. The broken line indicates the scattering parameter S11 (reflection coefficient on the input side), the solid line indicates the scattering parameter S21 (transmission coefficient from the input side to the output side), and the dashed line indicates frequency responses of scattering parameter S22 (the reflection coefficient of the output side). These results exhibit that sufficient gains are obtained at each of the frequency bands 1 GHz and 4.9 GHz, which are design frequencies, while the impedance matching is established on both of the input side and the output side.

EFFECT OF THE INVENTION

According to the matching circuit of the present invention, the impedance matching is effected by a main-matching block and a series matching block, which is a part of a sub-matching block, or the first to the Nth series matching blocks in a case where a radio frequency signal is of the principal frequency. The impedance matching is effected by the main-matching block and the sub-matching block in a case where the radio frequency signal is not of the principal frequency. Thus, the impedance matching of a combined signal of two frequency bands can be achieved simultaneously at respective frequency bands.

In order to design a dual-band power amplifier capable of amplifying a combined signal of two frequency bands at respective frequency bands, simultaneously, the impedance matching is necessary between the input/output impedances of an amplification device 180 and the input/output impedances of peripheral circuits at the two frequency bands. By using the matching circuit according to the present invention in a power amplifier, it is possible to achieve a dual-band power amplifier capable of amplifying a combined signal of the two frequency bands, simultaneously.

The matching circuit or the dual-band power amplifier according to the present invention can be used in a radio frequency circuit, and there is no noticeable limitation to the radio frequency to be handled. In particular, it is effective, when used in a radio frequency circuit that operates at a high frequency, for example, from sub microwave band to microwave band, namely between 100 MHz and 30 GHz, both inclusive.

What is claimed is:
1. A matching circuit comprising:
   a main-matching block for performing impedance matching; and
   a sub-matching block for performing impedance matching;
   wherein the main-matching block and the sub-matching block are connected in series with each other in a signal path of a radio-frequency signal,
   wherein the sub-matching block comprises:
      a series matching block connected in series with the main-matching block; and
      a parallel matching network connected to the series matching block on the side opposite from the main-matching block, and also connected in parallel with the signal path;
   wherein the parallel matching network comprises:
      a first parallel matching block having one end connected to the series matching block;
      a second parallel matching block having one end connected to the other end of the first parallel matching block; and
      a third parallel matching block having one end connected to a connection point between the first parallel matching block and the second parallel matching block,
   wherein the first parallel matching block is configured to cause a connection point with the series matching block to be in an open state for a radio-frequency signal of a first frequency,
   wherein the second parallel matching block is configured to cause the connection point with the first parallel matching block to be in a shunted state for the radio-frequency signal of the first frequency,
   wherein the main-matching block and the series matching block are configured so that an impedance at one end of the series connection matches the impedance of the other end thereof at the first frequency, and
   wherein the main-matching block and the sub-matching block are configured so that the impedance at one end of the series connection matches the impedance of the other end thereof at a second frequency which is different from the first frequency.
2. The matching circuit as claimed in claim 1, wherein:
   when the impedance at one end of the matching circuit is an impedance $Z_T(f)$ dependent on a frequency f, the impedance of the other end of the matching circuit is an impedance $Z_0$ independent of the frequency f, and the first and second frequencies are represented by $f_1$ and $f_2$, respectively, the main-matching block is configured to effect impedance matching between an impedance $Z_T(f_1)$ and the impedance $Z_0$ at the first frequency $f_1$ and to convert an impedance $Z_f(f_2)$ into a given impedance $Z(f_2)$ at the second frequency $f_2$, and the sub-matching blocking is configured to keep a matched state between the impedance $Z_f(f_1)$ and the impedance $Z_0$ at the first frequency and to effect impedance matching between the impedance $Z_0$ and the impedance $Z(f_2)$ at the second frequency $f_2$.

3. The matching circuit as claimed in claim 2, wherein:

the series matching block is a transmission line which has a characteristic impedance same as the impedance $Z_0$, and the series matching block is formed of a transmission line of a predetermined length and the third parallel matching block has a predetermined reactance value so that the sub-matching block effects impedance matching between the impedance $Z_0$ and the impedance $Z(f_r)$ at the second frequency $f_r$.

4. The matching circuit as claimed in claim 2, wherein:

the second frequency $f_r$ is allowed to selectively take one of N predetermined frequencies, where N is an integer of 2 or greater, the series matching block is operable to select and set an arbitrary impedance conversion quantity selected from one or more of predetermined impedance conversion quantities, the third parallel matching block is operable to select and set an arbitrary reactance value selected from one or more predetermined reactance values, there are at least N combinations of the impedance conversion quantity and the reactance value that can be selected, the N second frequencies $f_r$ correspond to the N combinations on a one-to-one basis, and the sub-matching block is configured to effect impedance matching between the impedance $Z_0$ and the impedance $Z(f_r)$, by setting the impedance conversion quantity and the reactance value of the combination corresponding to the second frequency $f_r$ to the series matching block and the third parallel matching block.

5. A matching circuit comprising:

a main-matching block which performs impedance matching; and

N sub-matching blocks which perform impedance matching, where N is an integer of 2 or greater, the main-matching block and the N sub-matching blocks being connected in series with a signal path of a radio-frequency signal, wherein each of the sub-matching blocks comprises:

a series matching block connected in series with the signal path;

a switch connected to the series matching block on the side opposite from the main-matching block; and a parallel matching network connected in parallel with the signal path via the switch, wherein the parallel matching network comprises:

a first parallel matching block connected to the series matching block via the switch;

a second parallel matching block connected to the first parallel matching block on the side opposite from the switch; and a third parallel matching block connected to a connection point of the first parallel matching block and the second parallel matching block, wherein the first parallel matching block is configured to set a connection point with the series matching block via the switch to an open state for a radio-frequency signal at a first frequency, wherein the second parallel matching block is configured to set the connection point with the first parallel matching block to a shunted state for the radio-frequency signal at the first frequency, wherein the main-matching block and the series matching blocks of the N sub-matching blocks are configured so that at the first frequency, an impedance at one end of the series connection matches an impedance of the other end thereof and at a selected one of N second frequencies, impedances are matched each other at one end and the other end of a series connection of one of the N sub-matching blocks corresponding to the switch having been set to an ON state, the series matching blocks of the sub-matching blocks on the signal path between said one of the sub-matching blocks and the main-matching block, and the main-matching block.

6. The matching circuit as claimed in claim 5, wherein:

when the impedance of one end of the matching circuit is an impedance $Z_f(f)$ dependent on a frequency f, the impedance of the other end of the matching circuit is an impedance $Z_0$ independent of the frequency f, and the first frequency and selected one of N second frequencies are represented by $f_1$ and $f_2$, respectively, the main-matching block is configured to effect impedance matching between an impedance $Z_f(f_1)$ and the impedance $Z_0$ at the first frequency $f_1$ and to convert an impedance $Z_f(f_2)$ into a given impedance $Z(f_2)$ at the second frequency $f_2$, and the sub-matching block corresponding to the switch having been set to an ON state is configured to keep the impedance matching between the impedance $Z_f(f_1)$ and the impedance $Z_0$ at the first frequency and to effect impedance matching between the impedance $Z_0$ and the impedance $Z(f_2)$ at the second frequency $f_2$.

7. The matching circuit as claimed in claim 6, wherein:

the series matching block of each of the sub-matching blocks is a transmission line which has a characteristic impedance same as the impedance $Z_0$, and wherein for selected second frequency $f_2$, the switch in the corresponding one of the sub-matching blocks is set to an ON state, the length of the transmission line of the series matching block and the reactance value of the third parallel matching block in the sub-matching block corresponding to the selected second frequency $f_2$ are set so that the sub-matching block effects impedance matching between the impedance $Z_0$ and the impedance $Z(f_2)$ at the second frequency $f_2$.

8. A dual-band power amplifier comprising:

the matching circuit of any one of claims 1 to 7; and an amplification device connected to the matching circuit, wherein a signal of a first frequency $f_1$ and a signal of a second frequency $f_2$ are amplified selectively or simultaneously.

\* \* \* \* \*